United States Patent [19]
Chi

[11] Patent Number: 5,808,733
[45] Date of Patent: Sep. 15, 1998

[54] DEVICE FOR MEASURING FEEBLE LIGHT AND METHOD THEREOF

[75] Inventor: Kyeong-koo Chi, Seoul, Rep. of Korea

[73] Assignee: Samsung Electronics Co., Ltd., Suwon, Rep. of Korea

[21] Appl. No.: 740,670

[22] Filed: Feb. 24, 1997

[30] Foreign Application Priority Data

Oct. 31, 1995 [KR] Rep. of Korea ............ 95-39046

[51] Int. Cl.$^6$ .................................................. G01J 1/44
[52] U.S. Cl. ................... 356/226; 356/345; 250/214 VT
[58] Field of Search ................... 356/226, 345; 250/214 VT

[56] References Cited

U.S. PATENT DOCUMENTS 5,250,795  10/1993  Koishi et al. ............ 250/214

*Primary Examiner*—Georgia Y. Epps
*Assistant Examiner*—Reginald A. Ratliff
*Attorney, Agent, or Firm*—Jones & Volentine, L.L.P.

[57] ABSTRACT

In a device for measuring feeble light and a method thereof, the device includes a feeble light amplifying device having a reaction chamber with two transparent windows as a constituent part, a detector, and two mirrors. The feeble light generated in the reaction chamber in which an etching process is in progress is amplified by the mirrors and is then detected, whereby an etching endpoint can be accurately determined. Therefore, the damage to semiconductors due to overetching or underetching can be prevented.

21 Claims, 1 Drawing Sheet

DEVICE FOR MEASURING FEEBLE LIGHT AND METHOD THEREOF

BACKGROUND OF THE INVENTION

The present invention relates to a device for measuring feeble light, and more particularly, to a device for measuring feeble light generated in a reaction chamber, and a method for measuring thereof.

In fabricating semiconductors, the failure rate caused by etching problems can be reduced by accurately detecting the etching endpoint. However, the etch rate of a particular process, and thus the etching endpoint, is highly variable. This is because various conditions in the reaction chamber (e.g., temperature, pressure, the type and composition of gases used therein, etc.) each allow for some tolerance, respectively, so that the etching rate varies somewhat as the conditions vary within their respective tolerance limits.

Despite such variances, however, an accurate detection of this variable etching endpoint is required for preventing serious damage to semiconductor devices due to underetching or overetching.

A method generally used to solve the above problem is to detect the etching endpoint by measuring the light emitted in the reaction chamber. A more detailed description shall be given for this method with reference to the drawing shown in FIG. 1.

FIG. 1 shows a conventional device for measuring light generated in a reaction chamber. Referring to FIG. 1, the conventional light-measuring device includes a reaction chamber 10 having a Radio Frequency (RF) susceptor 12, a transparent window 16, and a detector 14 for measuring the light emitted through transparent window 16. In reaction chamber 10, RF susceptor 12 generates a plasma which emits light 18.

When a dry-etching process is being performed in reaction chamber 10, reaction residuum is generated from the reaction of an etchant in the plasma with a material forming a film which is being etched.

The etchant and the reaction residuum emit light 18, each having a different wavelength depending on the kinds of the etchant and the reaction residuum. At this time, the emitted light 18 does not have any specific directiveness in reaction chamber 10, that is, the light is emitted in every direction. Thus, only a very small amount of the light is transmitted through the simple transparent window 16 that is located in only one discrete place in the reaction chamber 10.

The amount of the reaction residuum generated in reaction chamber 10 gradually decreases in accordance with the depletion of the film material being reacted with the etchant. Therefore, as the etching process is being performed, the amount of etchant and the reaction residuum existing in reaction chamber 10 can be recognized by the detector 14, which detects the light generated by the etchant and reaction residuum transmitted through the transparent window 16 installed on reaction chamber 10.

For example, in case that silicon (Si) is etched by using a chlorine-series gas plasma, light having a wavelength (288 nm) peculiar to the silicon (i.e., the residuum generated by the reaction) is emitted at or above a certain light intensity during the etching operation. When the etching operation is completed, the amount of silicon reaction residuum in the reaction chamber decreases precipitously. Accordingly, the intensity of light having the wavelength (288 nm) peculiar to the silicon is greatly weakened. Thus, in theory, by detecting the change in the amount of light having the proper wavelength that is generated by the reaction residuum, completion of the etching process can be recognized.

However, it is very difficult to detect the light emitted from the etchant or the reaction residuum when their intensity is very low, making the accurate completion of the etching operation difficult to recognize. In particular, when a pat tern having a low open ratio (e.g., a contact hole) is formed, it becomes more difficult to detect the etching endpoint thereof.

As described above, in the device and method for measuring light emitted from the reaction chamber according to the conventional art, the intensity of the light emitted from the reaction chamber is so low that the detection of the etching endpoint is difficult. Therefore, semiconductors are likely to be damaged due to underetching or overetching.

SUMMARY OF THE INVENTION

To solve one or more of the above problems in the prior art, it is an object of the present invention to provide a device for measuring feeble light, which prevents the damage of semiconductor devices due to an etching operation by measuring the feeble light generated in the reaction chamber by using a means for amplifying the light emitted in the reaction chamber.

It is another object of the present invention to provide a method of measuring the feeble light emitted from the reaction chamber by using the device for measuring feeble light.

To accomplish the first object, there is provided a device for measuring feeble light comprising a feeble light amplifying device having a reaction chamber as a constituent part, and a detector.

The feeble light amplifying device is a resonant apparatus including the reaction chamber provided with two transparent windows, and two mirrors formed in parallel and directly opposite to each other having the reaction chamber interposed therebetween.

The transparent windows are installed directly opposite to the two mirrors. One of two mirrors is of 100% reflexibility, and the other is semitransmissive to light. The semitransmissive mirror reflects 70% to 90% of incident light. The resonant apparatus comprises the reaction chamber with the transparent windows and two mirrors.

The detector, a component of the device for measuring feeble light, is installed at the rear of the semitransmissive mirror, and detects the light emitted out through the transparent window of the reaction chamber.

To accomplish the second object, there is provided a method of measuring feeble light, comprising the steps of generating feeble light from a light-generating source, amplifying the feeble light, detecting the amplified light and analyzing the detected light.

In the present invention, a reaction chamber used in a semiconductor manufacturing device is utilized as the light-generating portion. However, the light-generating portion is not limited only to the reaction chamber.

The feeble light in the reaction chamber is generated by the particles in a plasma state. The feeble light emitted from the reaction chamber is amplified by the resonant apparatus having the reaction chamber as a constituent part.

The basic principle of the amplification of light by means of the resonant apparatus is the same as that of the generation of a laser. In the present invention, the resonant apparatus is capable of amplifying even very feeble light emitted from the reaction chamber.

The detection of the light amplified by the resonant apparatus is performed by the detector installed at the rear of the semitransmissive mirror of the resonant apparatus. Up to this step, only the light incident into the detector is detected. Finally, an analysis of the detected light is performed to recognize the wavelength of the emitted feeble light to see to which etchant or reaction residuum the emitted light is peculiar. Consequently, it can be easily determined whether or not the etchant or the reaction residuum exists in the reaction chamber.

Thus, according to the present invention, the resonant apparatus, having two mirrors separated from each other at a certain distance and a reaction chamber, detects even feeble light emitted from the reaction chamber. Therefore, in an etching process, the etching endpoint, and especially the etching endpoint of a contact hole which has been difficult to detect in the prior art, can be easily detected to thereby prevent the damage of the semiconductor devices due to underetching or overetching.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

A device for measuring feeble light and a method thereof according to the present invention will now be described in detailed with reference to the attached drawings. The device for measuring the feeble light will be described first, followed by a description for the method for measuring the feeble light by means of the device for measuring the feeble light.

Figure 1:
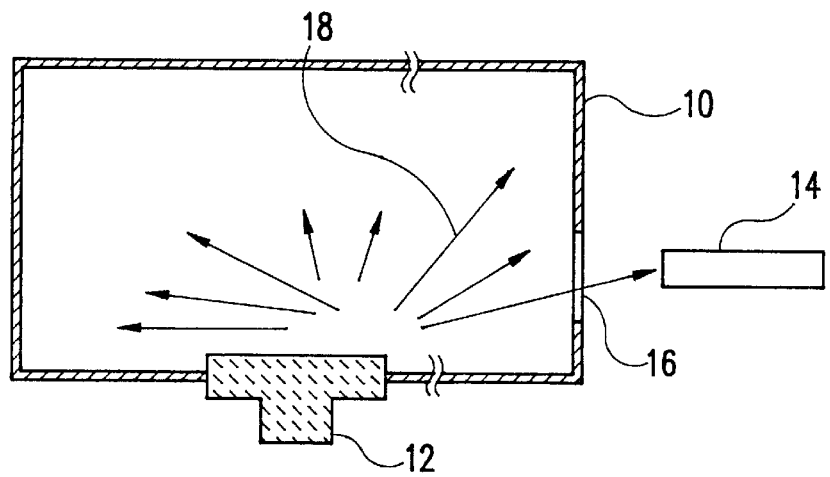
FIG. 1 is a schematic view illustrating a device for measuring light emitted from a reaction chamber according to the prior art.
Figure 2:
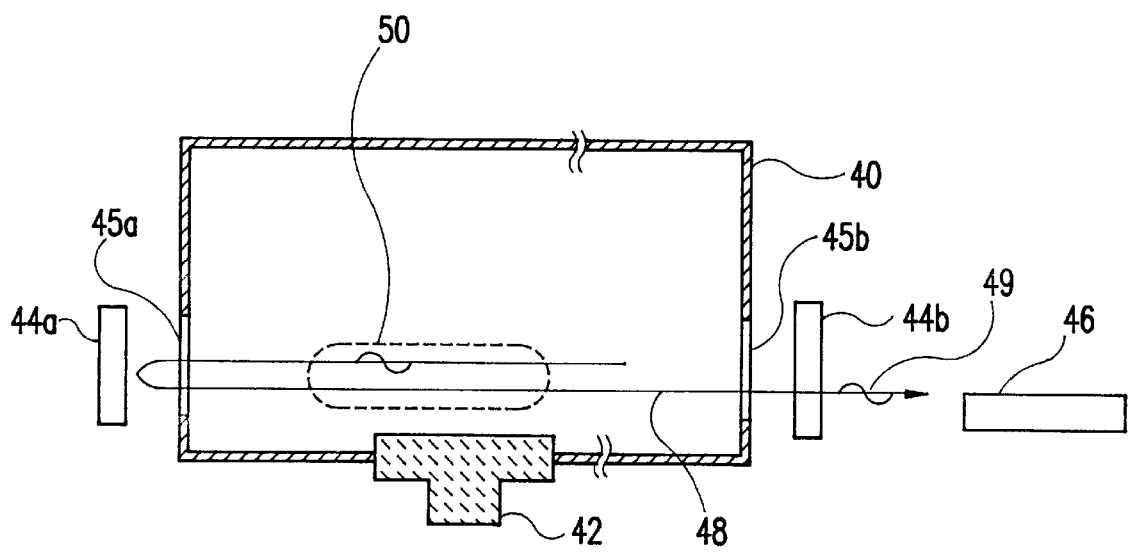
FIG. 2 is a schematic view illustrating a device for measuring feeble light emitted from the reaction chamber according to the present invention.

FIG. 2 is a schematic view illustrating a device for measuring feeble light emitted from the reaction chamber according to the present invention. Referring to FIG. 2, the feeble light-measuring device of the present invention is mainly constituted by a device for amplifying light and a light detector 46.

The light amplifying device (a resonant apparatus using general laser-generation principles) is constituted by a reaction chamber 40 and two mirrors 44a and 44b. The reaction chamber 40 includes a RF susceptor 42 and two optically-transparent windows 45a and 45b which are facing each other. A plasma of reaction materials is formed over the RF susceptor 42 in the reaction chamber 40. Two optically-transparent windows 45a and 45b serve as passages for light 48 emitting out from the reaction chamber 40.

One of the two mirrors 44a is of 100% reflexibility, while the other mirror 44b partly transmits light. More specifically, the light transmission ratio of mirror 44b is in the range of 0.7–0.9, that is, it reflects 70%–90% of incident light.

The method to amplify the emitted feeble light by the feeble light amplifying device disclosed above will be described with reference to FIG. 2.

First, an object (not shown), having a film deposited thereon to be etched, is loaded on the RF susceptor 42 in the reaction chamber 40. A plasma is formed in the reaction chamber 40 in order to etch the object. While etching the object by using the plasma, a residuum is generated by the reaction of the etchant in the plasma with the object in the reaction chamber 40. The etchant and the reaction residuum emit their own particular, different wavelengths of light, respectively. The emitted light 48 has no specific directiveness as in the conventional art. However, some of the light 48 is emitted out from the reaction chamber 40 through the two transparent windows 45a and 45b installed on the reaction chamber 40. The emitted light 48 travels back and forth between the two mirrors 44a and 44b until the light is amplified to a certain intensity.

A reference numeral 50 in FIG. 2 identifies an area inside the reaction chamber 40 where the light is amplified by stimulated light emission. The emitted light 48 keeps stimulating the emission of light by passing through area 50. More specifically, while traveling back and forth between the two mirrors 44a and 44b, the light collides with other etchant or reaction residuum on a path between two mirrors 44a and 44b in the reaction chamber 40, to thereby stimulate the emission of light. Accordingly, the light emitted by the stimulation and the light having caused the first stimulation travel together, back and forth between mirrors 44a and 44b. The two mirrors 44a and 44b are precisely installed in parallel along a straight line.

If the intensity of the light 48 emitted by the stimulation between two mirrors 44a and 44b increases to a certain degree, a portion of the emitted light is transmitted through the semitransmissive mirror 44b. This transmitted light 49 is detected by a detector 46 which is located at the rear of the semitransmissive mirror 44b. Then, by analyzing the detected light, it can be recognized whether or not the etchant and the reaction residuum exist in the reaction chamber 40.

As described above, the device for measuring feeble light according to the present invention is provided with two mirrors, precisely installed in parallel, having a reaction chamber therebetween in order to amplify feeble light emitted in the reaction chamber. In addition, by detecting the feeble light using such a device, the present invention can easily solve the problem of detecting the etching endpoint, which was a major problem in the prior art. In particular, by applying the present invention to a conventional process for forming contact holes for example, the etching endpoint of the contact hole can be easily detected. Thus, the damage to a semiconductor device caused by underetching or overetching can be prevented.

While the present invention has been described with reference to the etching endpoint, the device and method according to the present invention is applicable to any process in which light is emitted in the reaction chamber.

The present invention is not restricted to the embodiment described above. It is apparent that various changes may be effected by those skilled in the art within the technical spirit of the invention.

What is claimed is:

1. A device for measuring feeble light, comprising:
    a feeble light amplifying device including a reaction chamber, said reaction chamber being positioned such that said feeble light generated therein and said amplified light repeatedly pass through opposite sides of said reaction chamber; and
    a detector communicating with said light amplifying device.

2. A device for measuring feeble light as claimed in claim 1, wherein said feeble light amplifying device is a resonant apparatus.

3. A device for measuring feeble light as claimed in claim 2, said resonant apparatus comprises said reaction chamber and two mirrors, said two mirrors being formed in parallel and directly opposite to each other, and having said reaction chamber interposed therebetween.

4. A device for measuring feeble light as claimed in claim 1, wherein said reaction chamber includes two transparent windows formed on the opposite sides of said reaction chamber, and two parallel mirrors directly opposite each other and located a predetermined distance from said reaction chamber and having the reaction chamber disposed therebetween, each of said two mirrors arranged to oppose respective of said two transparent windows.

5. A device for measuring feeble light as claimed in claim 3, wherein said reaction chamber includes two transparent windows formed on the opposite sides of said reaction chamber, each of said two mirrors arranged to oppose respective of said two transparent windows.

6. A device for measuring feeble light as claimed in claim 3, wherein one of said two mirrors has 100% light reflexibility, and the other is semitransmissive to light.

7. A device for measuring feeble light as claimed in claim 6, wherein said detector is installed at a rear of said semitransmissive mirror and detects lights emitted through said semitransmissive mirror.

8. A method of measuring feeble light, comprising the steps of:
   generating feeble light from a light-generating source such as a reaction chamber;
   amplifying said feeble light by allowing said feeble light generated in said reaction chamber and said amplified light to repeatedly pass though the reaction chamber;
   detecting said amplified light; and
   analyzing said detected light.

9. A method of measuring feeble light as claimed in claim 8, wherein a resonant apparatus is used for amplifying said feeble light in said amplifying step.

10. A method of measuring feeble light as claimed in claim 9, wherein said resonant apparatus in said amplifying step is formed using said reaction chamber provided with transparent windows, and two mirrors in parallel directly opposite each other separated a predetermined distance from said reaction chamber, which is located therebetween.

11. A method of measuring feeble light as claimed in claim 10, wherein said transparent windows are installed directly opposite to said two mirrors.

12. A method of measuring feeble light as claimed in claim 10, wherein one of said two mirrors has 100% light reflexibility, and the other is semitransmissive to light.

13. A method of measuring feeble light as claimed in claim 12, wherein said semitransmissive mirror reflects 70% to 90% of incident light.

14. A method of measuring feeble light as claimed in claim 12, wherein a detector installed at a rear of said semitransmissive mirror is used for detecting said amplified light in said detecting step.

15. A method of measuring feeble light as claimed in claim 8, wherein said feeble light from said generating step comprises etchant and residuum light, each having respective, different wavelengths.

16. A method of measuring feeble light as claimed in claim 15, said amplifying step further comprising the steps of:
   gathering, by two mirrors, said feeble light that is transmitted through a resonant apparatus; and
   reflecting said gathered feeble light, continuously, between said two mirrors until said gathered feeble light reaches a certain amplified intensity.

17. A method of measuring feeble light as claimed in claim 16, said reflecting step further comprising the step of amplifying said gathered feeble light by stimulated light emission.

18. A method of measuring feeble light as claimed in claim 17, said detecting step further comprising the step of:
   gathering a portion of said gathered feeble light having a certain amplified intensity that is transmitted through one of said two mirrors, which is semitransmissive to light.

19. A method of measuring feeble light as claimed in claim 18, said analyzing step further comprising the step of identifying the level of the etchant and reaction residuum light in said gathered feeble light having a certain amplified intensity.

20. A device for measuring feeble light, comprising:
   a feeble light amplifying device including a reaction chamber as a component; and a detector,
   wherein said feeble light amplifying device is a resonant apparatus, said resonant apparatus comprising said reaction chamber and two mirrors, said two mirrors being formed in parallel and directly opposite to each other, and having said reaction chamber interposed therebetween.

21. A method of measuring feeble light, comprising the steps of:
   generating feeble light from a light-generating source, such as a reaction chamber;
   amplifying said feeble light in a resonant apparatus;
   detecting said amplified light; and
   analyzing said detected light,
   said reaction chamber having two transparent windows, and two mirrors in parallel and directly opposite to each other separated a predetermined distance from said reaction chamber, said reaction chamber being disposed between said two mirrors.

* * * * *